United States Patent

[11] 3,631,311

[72] Inventor Reiner Engbert
Talheim, Germany

[21] Appl. No. 808,153

[22] Filed Mar. 18, 1969

[45] Patented Dec. 28, 1971

[73] Assignee Telefunken Patentverwertungsgesellschaft m.b.H.
Ulm (Danube), Germany

[32] Priority Mar. 26, 1968

[33] Germany

[31] P 17 64 048.1

[54] SEMICONDUCTOR CIRCUIT ARRANGEMENT WITH INTEGRATED BASE LEAKAGE RESISTANCE

6 Claims, 3 Drawing Figs.

[52] U.S. Cl. .......... 317/235 R, 317/235 D, 317/235 E, 317/235 Z

[51] Int. Cl. .......... H01l 1/24, H01l 19/00

[50] Field of Search .......... 317/235, 235 D, 235 E

[56] References Cited

UNITED STATES PATENTS

| | | | |
|---|---|---|---|
| 3,395,320 | 7/1968 | Ansley | 317/235 |
| 3,416,049 | 12/1968 | Bohn et al. | 317/235 |
| 3,423,650 | 1/1969 | Cohen | 317/235 |
| 3,448,344 | 6/1969 | Schuster et al. | 317/235 |
| 3,510,735 | 5/1970 | Potter | 317/235 |
| 3,418,545 | 12/1968 | Hutson | 317/235 |
| 3,519,899 | 7/1970 | Yamada | 317/235 |

*Primary Examiner*—John W. Huckert
*Assistant Examiner*—William D. Larkins
*Attorney*—Spencer & Kaye

ABSTRACT: The invention relates to an integrated circuit arrangement comprising a semiconductor body having regions of a first type of conductivity separated by zones of a second type of conductivity. One or more of the regions serves as the collector region of a transistor, the base region thereof being let into the collector region and the emitter region being let into the base region. A separating zone overlaps a portion of the collector region at the semiconductor body surface and extends into the base region whereby a base leakage resistance for the transistor is provided by the bulk resistance between the contact to the separating zone and the base contact.

Inventor:
Rainer Engbert
by Spencer & Kaye
ATTORNEYS

Inventor:
Reiner Engbert
by Spencer & Kaye
ATTORNEYS

SEMICONDUCTOR CIRCUIT ARRANGEMENT WITH INTEGRATED BASE LEAKAGE RESISTANCE

SUMMARY OF THE INVENTION

In such a circuit arrangement, the invention consists in that the separation zone of the second type of conductivity overlaps a portion of the collector region at the semiconductor surface and extends into the base region of the second type of conductivity.

As a result of the measures according to the invention, a circuit arrangement is obtained wherein a transistor is combined with a base leakage resistance without a separate monocrystalline semiconductor region of the first type of conductivity being necessary for the production of the resistance.

The measures according to the invention have proved particularly advantageous when an annular emitter region formed by diffusion is let into the base region and ohmic contact is made to the base region within this emitter diffusion ring.

The invention is based on recognition of the fact that the economic production of integrated semiconductor circuits can be considerably increased by reducing the semiconductor area needed, by simplifying the manufacturing process and by reducing the number of components per integrated circuit while the capacity of the circuit remains constant.

BRIEF DESCRIPTION OF THE DRAWINGS

The invention will now be described in greater detail by way of example with reference to the accompanying drawings, in which.

DESCRIPTION OF THE PREFERRED EMBODIMENT

Figure 1:
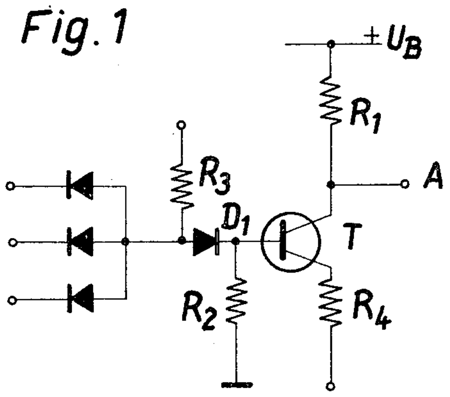
FIG. 1 is a circuit diagram of a circuit adapted to be accommodated in integrated form on a single conductor chip.

In FIG. 1 a circuit is illustrated composed of diodes, resistors and a transistor, which circuit is adapted to be accommodated, in integrated form, on a single semiconductor chip. The procedure is that, in order to reduce the cost in the manufacture of the circuit, a plurality of similar circuits are produced simultaneously on one semiconductor wafer. The circuits are subsequently separated by splitting up the semiconductor wafer. The individual circuit elements are separated from one another by means of barrier layers and accommodated, by means of the known diffusion technique, in semiconductor regions which are electrically insulated from one another. The resistors $R_1$, $R_2$, $R_3$ and $R_4$ consist of channellike regions which are diffused into the semiconductor body and which are each provided, at both ends, with an electrical connection. It is often necessary to construct the resistance regions in serpentine form in order to achieve a desired resistance value. In any case, the resistors take up a great deal of active semiconductor area at the surface of the semiconductor. Hitherto, the same active area has been needed for a resistor as for a transistor. In the circuit construction shown in FIG. 1, the individual components are electrically interconnected at the surface of the semiconductor by means of conducting paths. Furthermore, there are metal contacts for the connection of the lead-in elements to the circuit at the semiconductor surface which is generally covered with an insulating layer, for example with a layer of silicon dioxide, in order to protect the components. The base leakage resistor $R_2$ which connects the base electrode to the lowest potential occurring in the circuit, frequently serves to reduce the turnoff time of the transistor.

An integrated semiconductor circuit has already been proposed earlier wherein the base leakage resistance is formed by the fact that the base and the emitter electrode are disposed on one surface of a semiconductor body and the emitter region is short circuited with the base region at the side remote from the base electrode. In such an arrangement, therefore, the base electrode is connected to the emitter electrode through a resistance formed by the base region. Frequently, however, in addition to the base leakage resistance, an emitter resistance $R_4$ (FIG. 1) is needed and in many practical cases is connected to a higher potential than is the base leakage resistance $R_2$. This circuit can also be realized by the arrangement according to the invention without the production of the base leakage resistance being necessary by a diffusion process in a separate semiconductor region.

By building the base leakage resistance $R_2$ (FIG. 1) into the transistor, a relatively large area of active semiconductor surface is saved so that the extent of the integrated circuit is reduced and the number of circuits made from one semiconductor wafer can be increased. This applies, in particular, to logic circuits wherein the turned-on, current-conducting transistors are overdriven, for example for transistor-transistor logic, diode-transistor logic and resistor-transistor logic.

The distance between the base electrode and the short circuit point between the base region and the separation diffusion zone must be selected, for a transistor in an integrated, logical semiconductor circuit, so that the resistance of the base region between these two points corresponds to the required resistance $R_2$ in the integrated semiconductor circuit. A variation in the resistance value may also be effected by varying the size of the area in which the base region and the separation diffusion zone overlap. For diode-transistor logic, the resistance of the base region between the base electrodes and the short circuit point between the separation and diffusion zone and the base region preferably amounts to about 2 kΩ.

Figure 2:
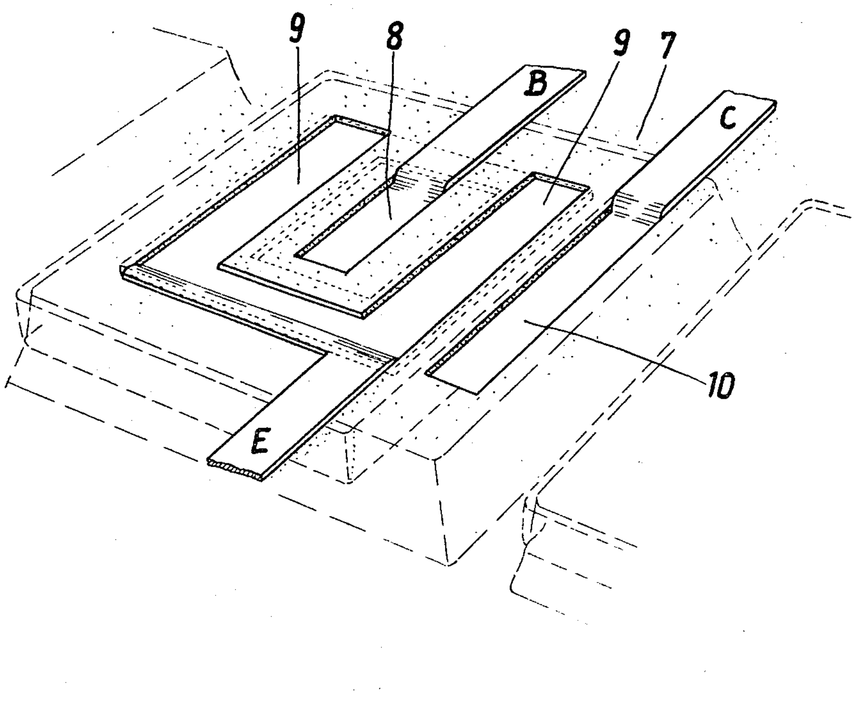
FIG. 2 is a plan view of part of an integrated semiconductor circuit in which a transistor as in FIG. 1 is accommodated.
Figure 3:
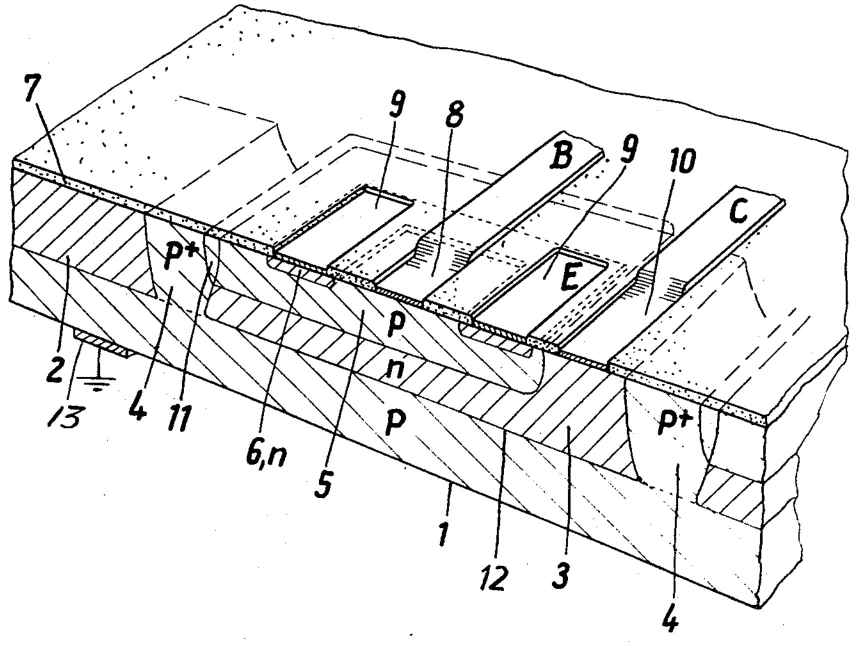
FIG. 3 is a sectional perspective view of the integrated semiconductor circuit of FIG. 2.

FIG. 2 shows in plan view and FIG. 3 in a sectional, perspective view, the part of an integrated semiconductor circuit in which as in FIG. 1 the transistor T is accommodated. In order to produce the semiconductor chip, a layer 2 of N-type conductivity has first been deposited epitaxially on a semiconductor wafer 1 of silicon, for example of P-type conductivity. This layer of N-type conductivity has been divided, by means of so-called separation diffusion, into semiconductor regions 3 which are separate from one another and into which the semiconductor components of the integrated circuit are introduced. Thus the individual semiconductor regions 3 are separated from one another by the diffusion zones 4 which are of $P^+$-type conductivity and merge into the basic material 1 of P-type conductivity. Thus the semiconductor region 3 of N-type conductivity illustrated in FIGS. 2 and 3 is bounded by a PN-junction 12 which leads to the surface of the semiconductor and the geometry of which may be for example rectangular at the semiconductor surface. This semiconductor region 3 serves in the manufacture of a transistor as a collector region into which a base region 5 of P-type conductivity is diffused. According to the invention, the base region 5 is made so large that a portion of its margin at the semiconductor surface extends into the separation diffusion zone 4. The overlapping area between the base region 5 and the separation diffusion zone 4 is distinguished by the numeral 11 in FIG. 3. With a barrier layer between the separation diffusion zone and the semiconductor region 3 having a rectangular geometry at the surface of the semiconductor, the base region 5 is preferably made so large that it extends into the separation diffusion zone at three boundary sides at the surface of the semiconductor. Bordering on the fourth boundary side of the base region at the surface of the semiconductor is the surface area of the collector region 3 adapted for making contact.

An emitter region 6 of N-type conductivity and in the form of a rectangular frame for example is in turn diffused into the base region. With the exception of the contact points for the various semiconductor regions, the surface of the semiconductor is covered with an insulating layer 7 of silicon dioxide for example. The collector region is electrically connected, via the metal contact 10, to other components, not illustrated, of the integrated circuit, while the contact 8 situated inside the emitter region is provided for making contact to the base region 5. Contact to the emitter region 6 may be made by means of a U-shaped metal connection 9 for example.

The separation diffusion zone 4 or the semiconductor substrate 1 is likewise provided with an ohmic contact 13 which is connected to the lowest potential occuring in the circuit in question. This is generally the negative pole of the source of supply voltage. The bulk resistance between said contact 13 and the base connection 8 forms the required base leakage resistance $R_2$ (FIG. 1). The value of the base leakage resistance can also be varied by varying the depth of penetration or the cross section of the overlapping area 11 between separation diffusion zone 4 and the base region 5.

The semiconductor region 3 may, of course, have a circular or other geometry at the surface of the semiconductor. With a circular collector region it would be an advantage to make the base region 5 semicircular in which case the radius of the base semicircle at the surface of the semiconductor would be slightly larger than the radius of the collector region 3 so that the curved portion of the base boundary extends into the separation diffusion zone at the surface of the semiconductor. The arrangement according to the invention can be produced in known manner by means of the known masking, etching and diffusion technique. Apart from silicon, other semiconductor materials are, of course, suitable for the construction of the integrated semiconductor circuit arrangement according to the invention.

What I claim as new and desire to secure by Letters Patent of the United States is:

1. An integrated semiconductor circuit arrangement comprising a semiconductor body, monocrystalline semiconductor regions of a first type of conductivity in said semiconductor body for receiving components, at least one of said semiconductor regions of said first type of conductivity forming the collector region of a transistor, a base region of a second type of conductivity let into said collector region, an emitter region let into said base region, separation zones of said second type of conductivity separating and electrically insulating said semiconductor regions of said first type of conductivity from each other, a separation zone of said second type of conductivity overlapping a portion of said collector region at the surface of said semiconductor body and extending into said base region, means for providing an ohmic connection to said separation diffusion zones, and a separate ohmic contact for said base region, whereby the bulk resistance of the semiconductor body between said base contact and said means for providing an ohmic connection to said separation zones forms a base leakage resistance for said transistor.

2. An integrated semiconductor circuit arrangement as defined in claim 1, wherein the semiconductor body is of the second type of conductivity and comprises, an epitaxial layer of the first type of conductivity at the surface of the semiconductor body, and separation diffusion zones for dividing said layer into individual semiconductor regions of the first type of conductivity.

3. An integrated semiconductor circuit arrangement as defined in claim 2, wherein said emitter region is an annulus formed by diffusion let into said base region and said ohmic contact is connected to said base region within this emitter diffusion annulus.

4. An integrated semiconductor circuit arrangement as defined in claim 1, wherein said semiconductor region of said first type of conductivity has a rectangular geometry at the surface of the semiconductor and said base region is rectangular and extends into said separation diffusion zone at three sides.

5. An integrated semiconductor circuit arrangement as defined in claim 1, wherein said means for providing an ohmic connection to said separation diffusion zones connects said separation diffusion zones to the lowest potential occurring in said circuit.

6. An integrated semiconductor circuit as defined in claim 1 wherein said base contact is connected to said base region at a location such that the active portion of said base region beneath said emitter region simultaneously forms a part of said base leakage resistance.

* * * * *